United States Patent
Verspecht et al.

(10) Patent No.: US 7,282,926 B1
(45) Date of Patent: Oct. 16, 2007

(54) METHOD AND AN APPARATUS FOR CHARACTERIZING A HIGH-FREQUENCY DEVICE-UNDER-TEST IN A LARGE SIGNAL IMPEDANCE TUNING ENVIRONMENT

(76) Inventors: Jan Verspecht, Gertrudeveld 15, Londerzeel (BE) B-1840; Jean-Pierre Teyssier, 18 Rue Blanche Selva, Brive (FR) 79700

( * ) Notice: Subject to any disclaimer, the term of this patent is extended or adjusted under 35 U.S.C. 154(b) by 0 days.

(21) Appl. No.: 11/446,923

(22) Filed: Jun. 5, 2006

(51) Int. Cl.
G01R 27/04 (2006.01)
G01R 27/32 (2006.01)
H01P 5/18 (2006.01)

(52) U.S. Cl. ........................ 324/637; 324/641; 333/109
(58) Field of Classification Search ................ 324/637, 324/641; 333/109
See application file for complete search history.

(56) References Cited

U.S. PATENT DOCUMENTS

| | | | |
|---|---|---|---|
| 2,512,191 A | 6/1950 | Wolf | |
| 3,309,608 A | 3/1967 | Alford | |
| 3,409,826 A | 11/1968 | Goodman | |
| 3,522,526 A | 8/1970 | Sanderson | |
| 3,789,301 A | 1/1974 | Malaviya | |
| 4,072,897 A | 2/1978 | Takayama | |
| 4,720,677 A | 1/1988 | Donecker | |
| 4,803,419 A | 2/1989 | Roos | |
| 5,034,708 A | 7/1991 | Adamian | |
| 5,121,067 A | 6/1992 | Marsland | |
| 5,325,019 A | 6/1994 | Miller | |
| 5,557,245 A * | 9/1996 | Taketa et al. | 333/116 |
| 6,297,649 B1 | 10/2001 | Tsironis | |
| 6,509,743 B1 | 1/2003 | Ferrero | |
| 6,812,714 B2 | 11/2004 | Verspecht | |
| 6,859,029 B2 | 2/2005 | Yamanaka | |
| 6,980,064 B1 | 12/2005 | Boulerne | |
| 2006/0279275 A1 | 12/2006 | Simpson | |

FOREIGN PATENT DOCUMENTS

| | | |
|---|---|---|
| EP | 1 316 806 A1 | 6/2003 |
| EP | 1316806 A1 * | 6/2003 |
| PL | 338495 A1 | 8/2001 |

OTHER PUBLICATIONS

De Groote et al., An improved coupling method for time domain load-pull measurements, ARFTG 65th Conference Digest, Jun. 17, 2005.

(Continued)

*Primary Examiner*—Walter Benson
*Assistant Examiner*—Amy He

(57) ABSTRACT

An impedance tuning measurement setup and method for characterizing high frequency devices-under-test whereby one inserts an extremely low loss directive coupling structure between the terminal of the device-under-test and that part of the impedance tuner that generates the variable impedance. One or both coupled arm outputs of the directive coupling structure are connected to the inputs of a broadband RF receiver. By using the extremely low loss directive coupling structure one avoids the loss of energy caused by the distributed directional couplers or the resistive bridges used in prior art. The low loss directive coupling structure is formed by a small piece of conductive wire, which is inserted into the electro-magnetic waveguiding structure that guides the RF signals towards and from the DUT terminals. The ends of the small piece of conductive wire are connected to the center conductors of two electromagnetic waveguiding structures, which act as the coupling arms.

18 Claims, 8 Drawing Sheets

OTHER PUBLICATIONS

Lombardini et al., Criteria for Design of Loop-Type Directional Couplers for the L Band, IRE Transactions on Microwave Theory and Techniques, Oct. 1956, pp. 234-239.

Microlab/FXR, CE-N and CF-N series Loop Coupler Specifications, Oct. 27, 2005, [available on line] URL: http://www.microlab.fxr.com/pdf/CE-CF-Nseries.pdf.

H.C. Early, A Wide-Band Directional Coupler for Wave Guide, Proceedings of the I.R.E. and Waves and Electrons, Nov. 1946, pp. 883-886, USA.

H.C. Early, A Wide-Band Directional Coupler for Wave Guide, Proceedings of the I.R.E. and Waves and Electrons, Nov. 1946, pp. 883-886, USA.

* cited by examiner

METHOD AND AN APPARATUS FOR CHARACTERIZING A HIGH-FREQUENCY DEVICE-UNDER-TEST IN A LARGE SIGNAL IMPEDANCE TUNING ENVIRONMENT

CROSS-REFERENCE TO RELATED APPLICATIONS

Not Applicable

FEDERALLY SPONSORED RESEARCH

Not Applicable

SEQUENCE LISTING OR PROGRAM

Not Applicable

BACKGROUND OF THE INVENTION

1. Field of Invention

The present invention relates to the measurement of incident and reflected waveforms for microwave and radio-frequency (RF) devices-under-test (DUTs) under realistic large signal operating conditions.

2. Description of the Related Art

Modern wireless telecommunication systems use complex signals at high carrier frequencies, with frequencies typically in the GHz range. These signals are generated by electrical circuitry, like e.g. modulators and mixers that can typically only handle low power levels in the milliwatt range. The generated low power signals are amplified to a higher power level before being sent to the antenna. At the antenna power levels range from about 10 milliwatt for a cellular phone to about 100 Watt for a base station. The amplification of the signals is performed by means of high frequency power amplifiers. These amplifiers contain one or more high frequency power transistors. In order to build a good amplifier the designer needs a detailed knowledge of the behavior of the high frequency power transistors under a wide range of operating conditions. The knowledge of the transistor behavior is gained by using advanced microwave measurement set-ups and methods. The most advanced method that is available in the prior art is called the "time domain loadpull measurement" method, as described in the paper "Measurement and Control of Current/Voltage Waveforms of Microwave Transistors Using a Harmonic Load-Pull System for the Optimum Design of High Efficiency Power Amplifiers," authored by D. Barataud et al., IEEE Transactions on Instrumentation and Measurement, Vol. 48, no. 4, pp. 835-842, August 1999. With this method the transistor terminals are excited by signals that are very similar to the actual signals that the transistor would experience in an actual power amplifier circuit and the time domain voltage and current waveforms are determined as they appear at the transistor terminals under the given realistic large signal operating conditions. Our invention relates to a novel apparatus and an improved method to characterize a high-frequency device-under-test under such realistic operating conditions.

In the following we will present the prior art, which is illustrated in FIG. 1. First we will explain the prior art of realizing realistic large signal operating conditions. This is achieved by using one or more high frequency signal generators 11 in combination with variable impedance terminations 15, also called tuners. There are two kinds of tuners: active and passive tuners. Passive tuners generate variable impedances by simply reflecting microwave energy on a moveable mechanical structure (U.S. Pat. No. 6,297,649 by Tsironis) or on a controllable passive electronic circuit (U.S. Pat. No. 5,034,708 by Adamian). Note that "passive electronic circuit" refers to the fact that the electronic circuit does not contain any signal amplifier. Active tuners generate a variable impedance not by simply reflecting microwave energy, but by actually generating a signal (U.S. Pat. No. 3,789,301 by Malaviya) or by amplifying (U.S. Pat. No. 6,509,743 by Ferrero) the output signal generated by the transistor terminal and sending it back towards the terminal while controlling the phase and the amplitude of the generated or amplified signal.

Next we will explain the prior art of measuring the voltage and current waveforms at the terminals of the device-under-test. With existing prior art loadpull measurement setups the voltage and current waveforms are derived from the incident and reflected waveforms, which are sensed by means of distributed directional couplers 12 and 13 (U.S. Pat. No. 2,512,191 by Wolf) or by resistive bridges structures (U.S. Pat. No. 5,121,067 by Marsland), whereby the sensed signals are send to a single or multi-channel broadband microwave signal receiver 17. The distributed directional couplers 12 and 13 and resistive bridges are leveraged from existing vector network analyzer technology and are used because of their inherent high directivity.

One of the major difficulties of the prior art loadpull measurement methods is the generation, at the terminals of the transistor 14, of load impedances having a resistive part that is much higher or much lower than the characteristic impedance of the structures that are used to guide the microwave energy towards and away from said terminals. This characteristic impedance is typically 50 Ohms for today's loadpull setups, whereby one often needs to generate impedances with resistive parts as high as 1000 Ohms or as low as 1 Ohm. The difficulty arises because of significant energy losses in the distributed directional couplers 12 and 13 or the resistive bridge structures, which are typically placed in between the transistor 14 output terminal and the tuner 15. The losses in the distributed directional couplers 12 and 13 are called the insertion losses and their main causes are the skin effect losses in the metal that is used to construct the distributed directional coupler waveguiding structure. The insertion loss is significant because a distributed coupler has a length, which typically equals several times the wavelength corresponding to the highest frequency at which the coupler operates, typically more than 100 mm. The insertion losses of a directional resistive bridge are caused by the resistors, which are always present in such a structure.

Two solutions are present in the prior art to overcome the difficulties mentioned above and to generate very low or very high resistive parts for the load impedance. The first solution is to use active tuners, as described in the above-mentioned reference by Barataud et al. (1999). The amplifier inside the active tuner can fully compensate for said energy losses. The disadvantage of this solution is that active tuners are expensive and difficult to control across a wide frequency bandwidth when compared to passive tuners. Another disadvantage is that the active tuning approach has a low power handling capability when compared to passive tuners. This limitation is caused by the inevitable saturation of the amplifiers inside the active tuning circuitry. As a result active tuning approaches are seldom used for power levels above 10 Watt. Another solution is illustrated in FIG. 2. The energy losses of the distributed directional coupler 13 are avoided by putting it after the tuner 15, instead of between the tuner 15 and the output terminal of the device-under-test (DUT) 14. The disadvantage of this approach is that it is difficult to get accurate measurements of voltage and current waveforms. The difficulty is caused by the fact that with this solution the tuner 15 is in the path between the signal receiver 17 and the transistor 14 output terminal and as such said tuner 15 introduces distortions that are a function of the impedance state of the tuner 15. Advanced and lengthy calibrations procedures are needed in order to eliminate these distortions and, even with said calibration procedures available, one can never avoid the loss of measurement sensitivity when the tuner 15 reflects substantially all of the energy back towards the output terminal of DUT 14 without sending any relevant energy towards the distributed coupler 13. This drawback is most critical when it is necessary to measure information on the harmonics that are generated by the nonlinear behavior of the DUT 14. This results in noisy measurements, especially when the DUT 14 is saturated by a large amplitude input signal.

The voltage waveforms, current waveforms or RF power levels are measured by means of a single or multi-channel broadband microwave signal receiver 17. These signal receivers are typically connected to the coupled ports of distributed directive couplers 12 and 13, as such they sense a fraction of the energy of the incident as well as the reflected wave that travels through the main line of the distributed directive couplers 12 and 13. Several types of broadband microwave signal receivers are used, each type offering more or less information about the incident and reflected traveling waves going through the distributed directive couplers 12 and 13. The most simple broadband microwave signal receiver is a set of RF power meters, which only give access to the RF power in Watts or dBm. Some very simple setups can avoid distributed directive couplers and make direct use of a RF power meter as an RF load. More complex systems make use of distributed directive couplers and a vector network analyzer (VNA) as a signal receiver. Such a VNA with a proper power reference calibration provides both the amplitude and the phase of all incident and reflected traveling waves at the frequencies of interest. At any given frequency, when the incident and reflected wave amplitudes and phases are known at the output of the coupled arms of the distributed directive couplers 12 and 13, a proper calibration provides the incident and reflected RF voltage waves at the terminals of the DUT 14. Due to the nonlinearities of the DUT, spectral RF components are often generated at a set of harmonic frequencies; these spectral RF components are called harmonics. This is usually the case when large signals are applied to the DUT 14. The amplitudes and phases of these harmonics are of great interest for the knowledge of the DUT 14 electrical response. With said VNA, the fundamental frequency information is available in addition with the information at harmonic frequencies, but the phases of the harmonics relative to the fundamental component are not available. As such it is impossible, when using a VNA as a receiver 17, to reconstruct the time domain waveform by superposing the fundamental and harmonic waveforms. For that reason, a new generation of broadband RF receivers is sometimes employed: the Large Signal Network Analyzer (LSNA). As the main characteristic of large signal measurements of nonlinear devices like RF transistors is the harmonic frequency component generation, the LSNA, employed with a proper calibration, provides the amplitudes and phases of all measured frequencies, including harmonic frequencies, while preserving the phase relationship between all measured spectral components. The LSNA receiver inputs are typically connected to both coupled arms of the distributed directive couplers 12 and 13. Besides the LSNA, two other kinds of broadband RF receivers are sometimes used to measure time domain waveforms at the DUT 14 terminals: a so-called Microwave Transition Analyzer, in essence a sampling frequency convertor, and a high-speed oscilloscope.

3. Object and Advantages of the Present Invention

The present invention, as illustrated in FIG. 6 has the following three advantages, which are not simultaneously present in any system described in the prior art. First the impedance matching capability of the impedance tuning equipment 15 is substantially not affected by the insertion of the loop type coupling structure 19 because of the inherent low loss of said loop type directive coupling structure 19, in contrast to prior art where one uses a relatively high loss distributed coupler 13 or a resistive bridge. A second advantage is that the calibration procedure remains simple because the calibration coefficients do not depend on the variable impedance setting of the impedance tuning equipment 15. This is the case since the directive coupling structure 19 is inserted between the output terminal of the DUT 14 and the impedance tuning equipment 15, in contrast to some prior art, where the impedance tuning equipment 15 is placed in between the coupler 13 and the output terminal of the DUT 14. A third advantage is that there is no accuracy problem when the impedance tuning equipment 15 is set to reflect substantially all of the energy of a voltage wave back towards the terminal of the DUT 14. With such a setting of the impedance tuning equipment substantially no energy is send to the broadband RF receiver 17 in case the impedance tuning equipment 15 is placed between the coupler 13 and the terminal of the DUT 14. This causes noisy measurements with the abovementioned prior art.

BRIEF SUMMARY OF THE INVENTION

The invention relates to a loadpull measurement setup and method whereby one inserts an extremely low loss directive coupling structure between the output terminal of a device-under-test, usually a RF transistor, and the part of the tuner that generates the variable impedance. One or both coupled arm outputs of the low loss directive coupling structure are connected to the inputs of a broadband RF receiver. One hereby avoids the loss of energy caused by the distributed directional couplers or the resistive bridges, which are used in prior art. The low loss directive coupling structure is formed by a small conductive loop, which is inserted into the electro-magnetic waveguiding structure that guides the RF signals towards and from the DUT terminals. Both ends of the conductive loop are connected to the center conductors of two separate electro-magnetic waveguiding structures, which act as the coupling arms. The combination of the conductive loop and the coupled arms is called the loop type coupling structure. In a first embodiment the loop type coupling structure is part of a separate connectorized electro-magnetic wave guiding structure that is inserted between the connector of the tuner and the connector of the DUT fixture or the wafer probe. In an alternative embodiment the loop type coupling structure is fully integrated in the electromagnetic waveguiding structure of the tuner, thereby eliminating the extra connectors that are needed with the first embodiment.

DETAILED DESCRIPTION

Figure 1:
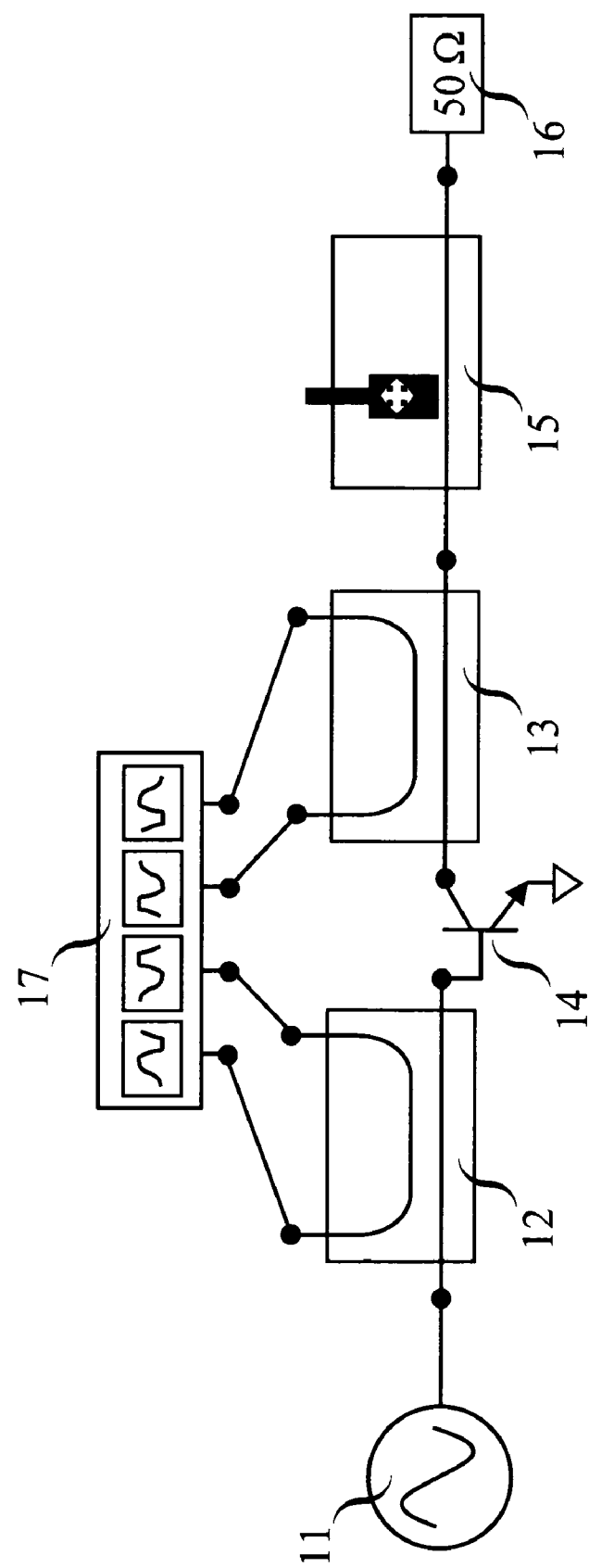
FIG. 1 (Prior Art) Depicts a loadpull measurement setup with a distributed coupler positioned in between the device-under-test and the tuner.
Figure 2:
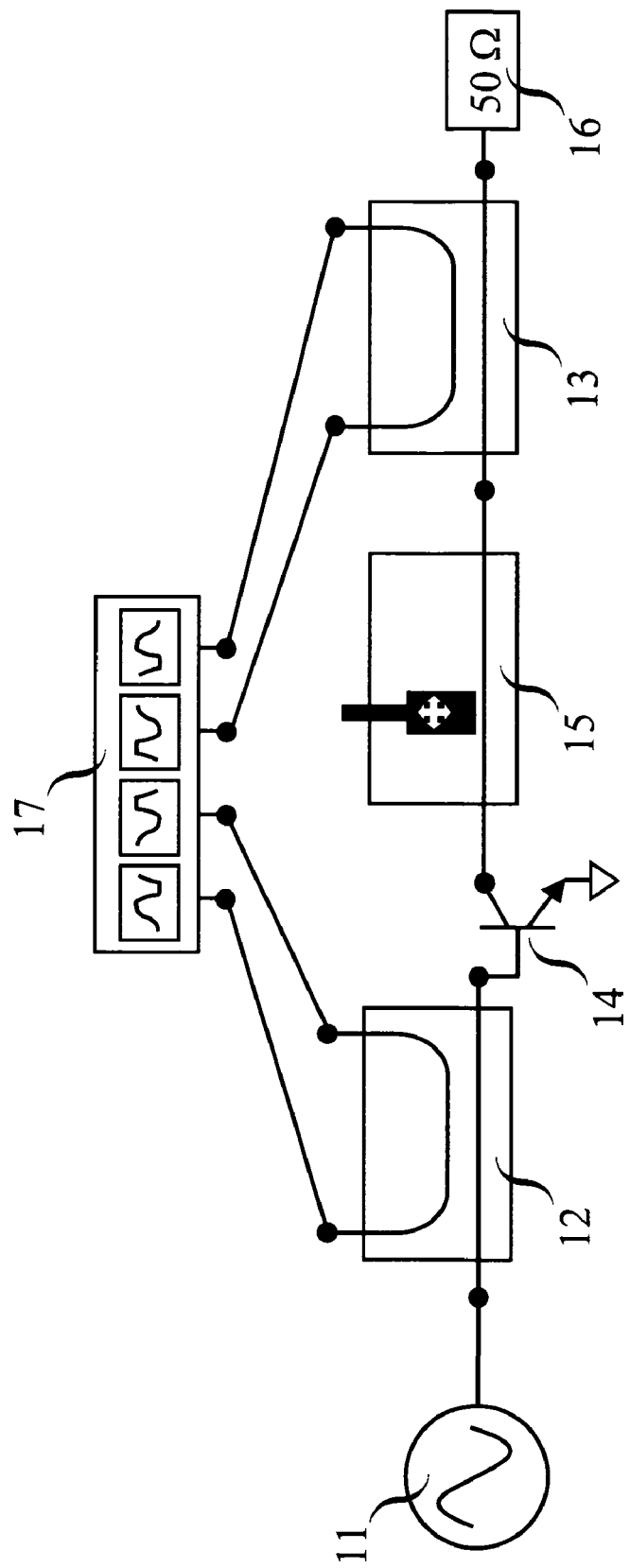
FIG. 2 (Prior Art) Depicts a loadpull measurement setup with a tuner positioned in between the device-under-test and the distributed coupler.
Figure 6:
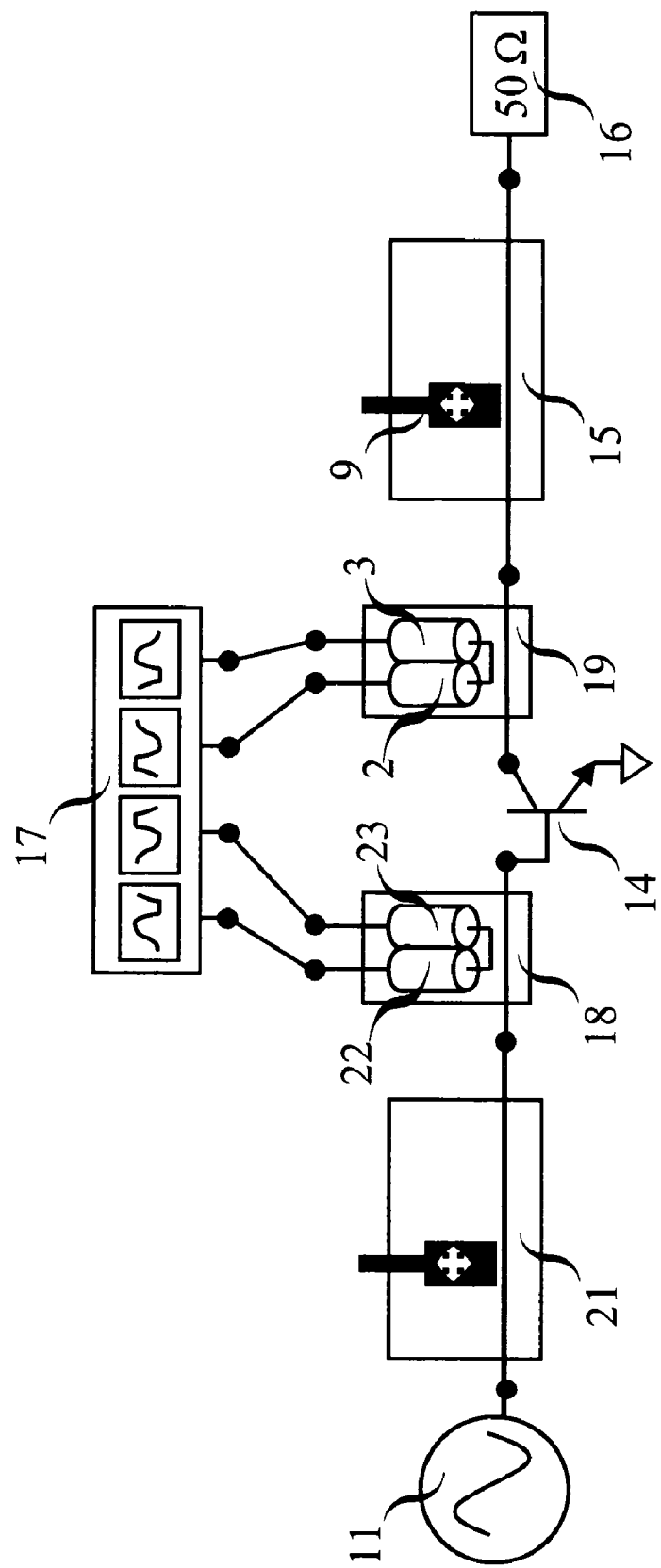
FIG. 6 Loadpull measurement setup according to the present invention wherein a loop type coupling structure is positioned in between the device-under-test and the tuner.

The present invention is described in "An improved coupling method for time domain load-pull measurements," by F. De Groote, J. Verspecht, C. Tsironis, D. Barataud, J. P. Teyssier, 65$^{th}$ ARFTG conference digest, Jun. 12, 2005. A preferred first embodiment is depicted in FIG. 6. The invention relates to a loadpull measurement setup and method whereby one inserts an extremely low loss directive coupling structure 19 between the terminal of a device-under-test 14 and the part 9 of the tuner 15 that generates variable impedance. One hereby avoids the loss of energy caused by the distributed directional couplers 12 and 13 or the resistive bridges, which are used in the prior art as depicted in FIG. 1. The low loss directive coupling structure 19 that is used is a dual directional version of the loop type coupler described in "Criteria for the Design of Loop-Type Directional Couplers for the L Band," by P. P. Lombardini, R. F. Schwartz and P. J. Kelly, IRE Transactions on MTT, October 1956, also described in great detail in European patent application EP 1316 806, by Yhland and Stenarson.

First we provide a detailed description of the low loss directive coupling structure 19, which is used with the present invention. Next we explain the novel use of the low insertion loss directive coupling structure 19 as an improved means to sense the voltage and current waveforms with a loadpull setup.

Figure 3:
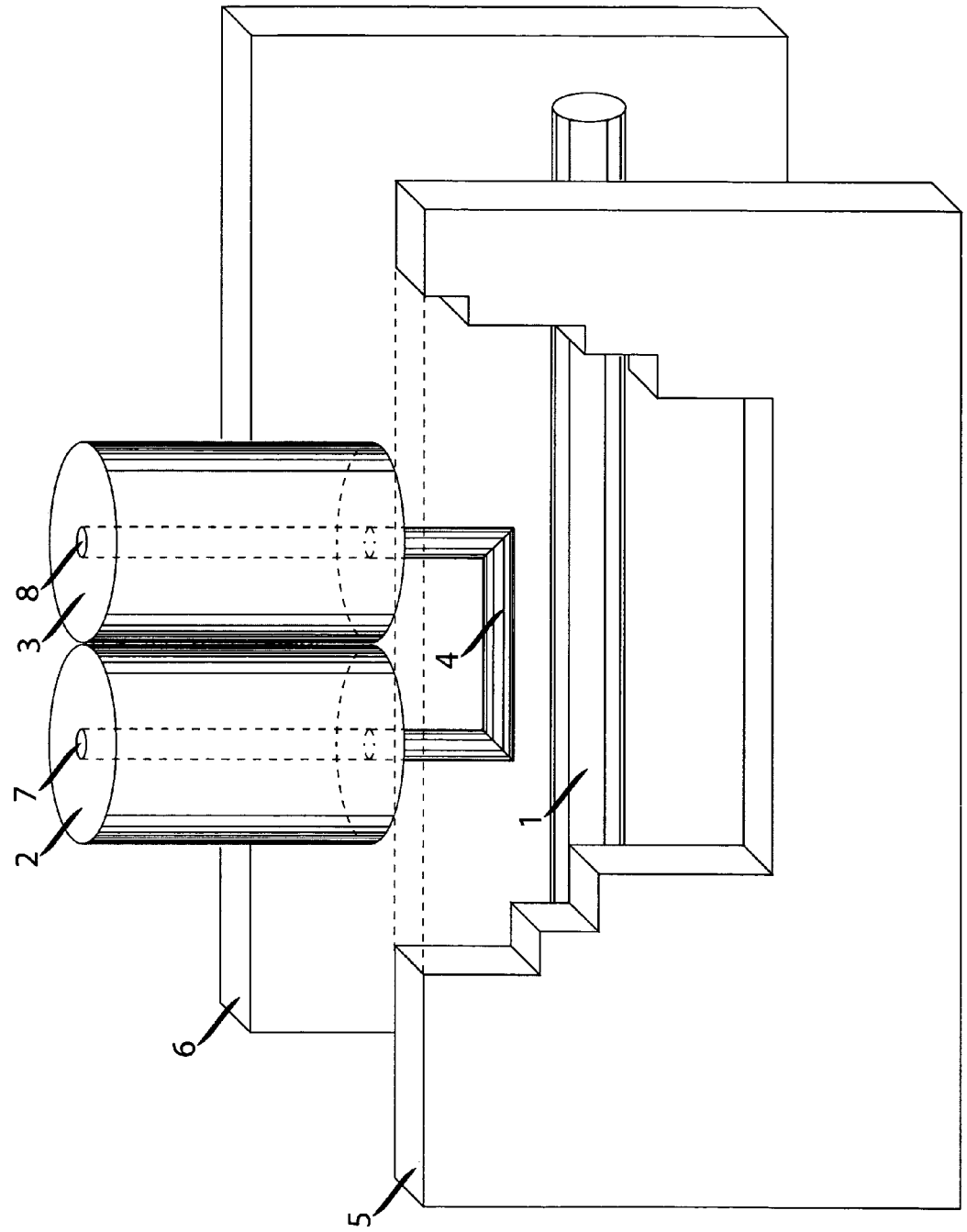
FIG. 3 Depicts the loop type coupling structure in which the main line is a slabline electro-magnetic waveguiding structure, which is often used for fabricating a mechanical tuner.
Figure 4:
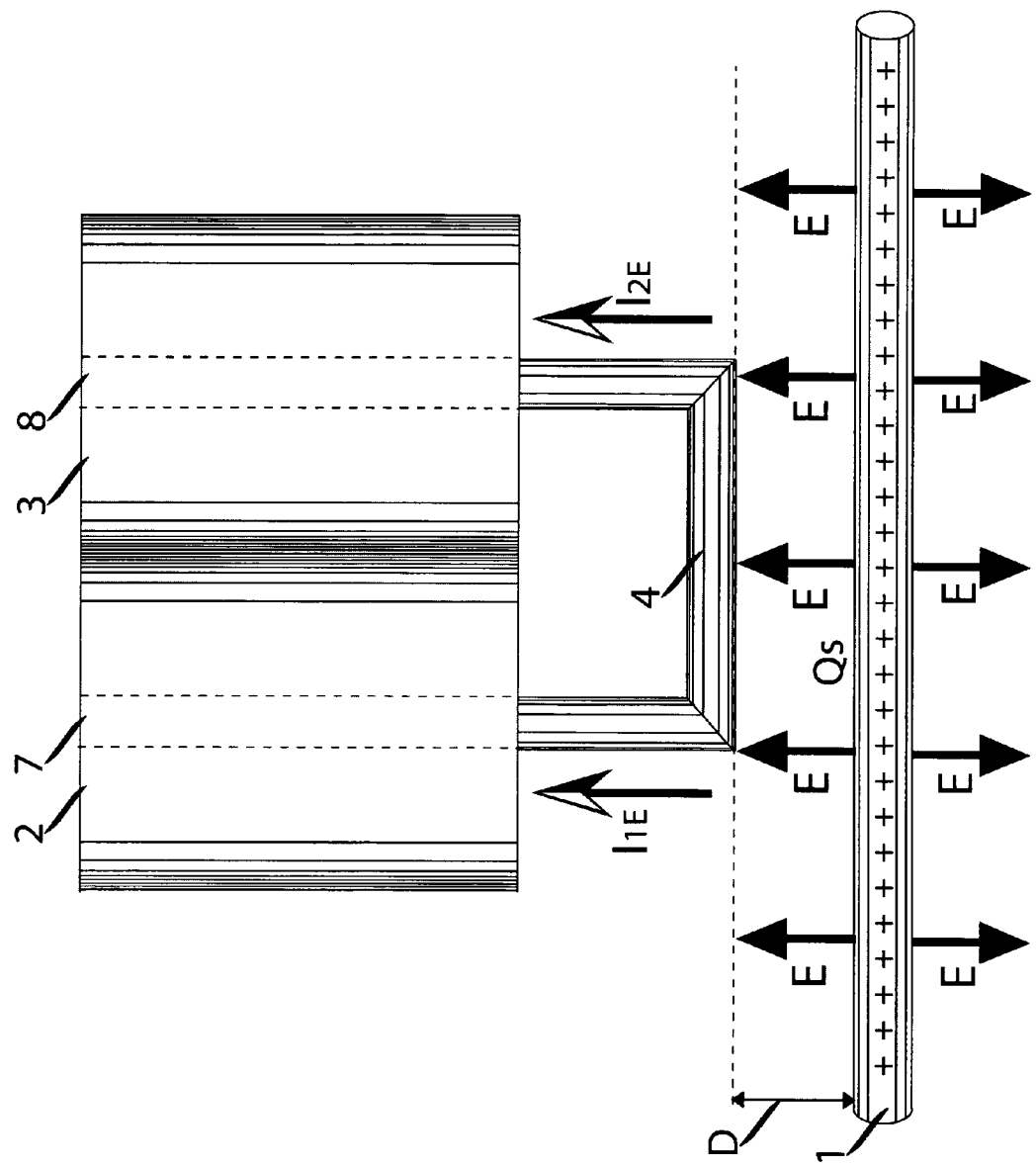
FIG. 4 Depicts the electrical field above the center conductor of the slabline and how this electrical field induces currents in the coaxial coupled arms, which are in phase with each other.
Figure 5:
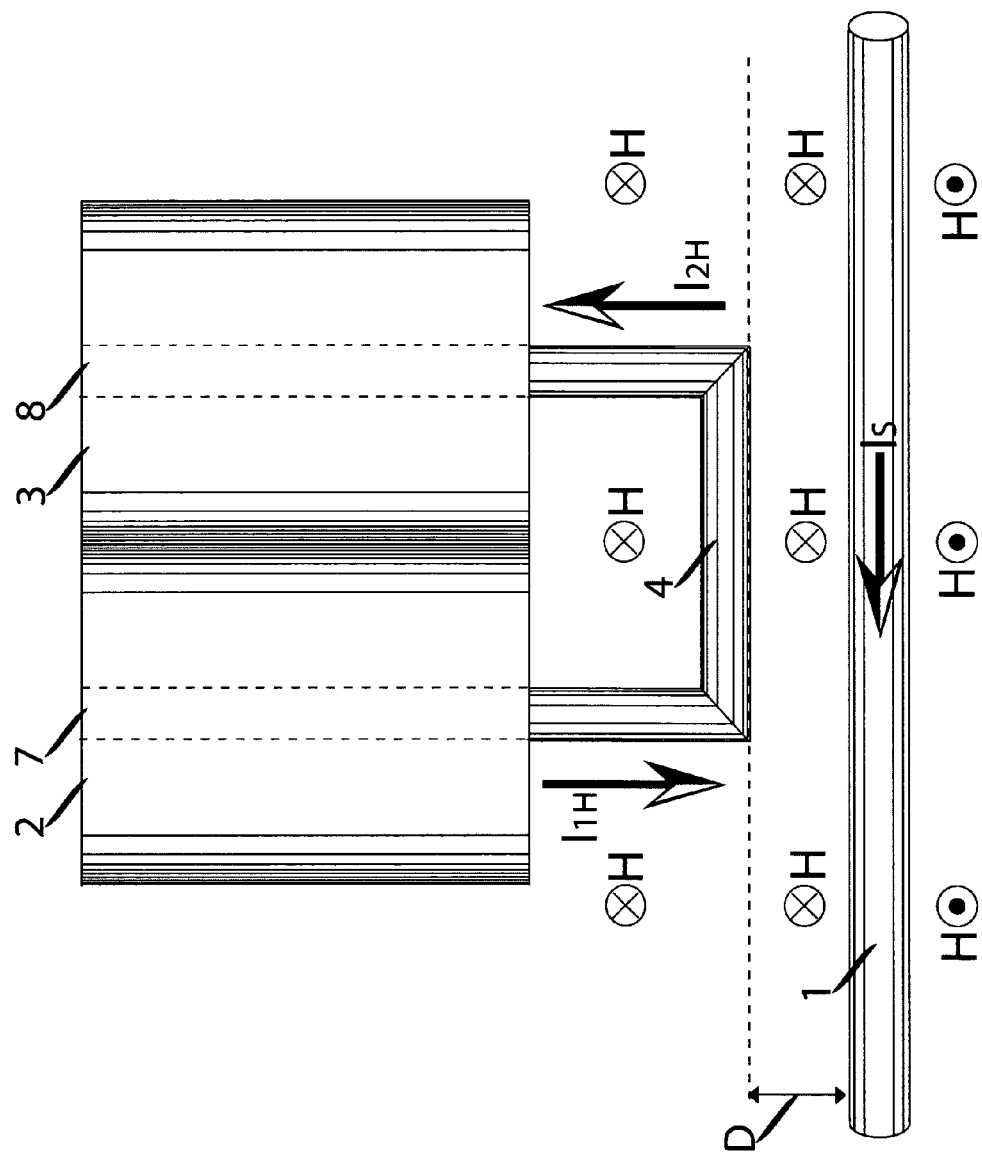
FIG. 5 Depicts the magnetic field above the center conductor of the slabline and how this magnetic field induces currents in the coaxial coupled arms, which are in opposite phase with each other.

The Low Insertion Loss Directive Coupling Structure the principle of the low insertion loss coupling structure is illustrated in FIG. 3, FIG. 4 and FIG. 5. For simplicity the operation is explained with an example whereby said directive coupling structure 19 is used in an electromagnetic waveguiding structure that is a slabline. The principle of operation is based on constructive and destructive interference effects between the electrical and the magnetic fields and can be applied on any electro-magnetic waveguiding structure. In FIG. 3 the main electromagnetic waveguide, which carries the traveling voltage waves to be sensed, is a slabline formed by ground plane 5 and ground plane 6, which form the walls of the slabline, and center conductor 1. The coupled arms 2 and 3 are coaxial transmission lines.

A short piece of conductive wire 4 forms a loop and connects the center conductor 7 of coaxial line 2 with the center conductor 8 of coaxial line 3. It is important to note that the length of the piece of conductive wire 4 is small when compared to the wavelengths of the traveling voltage waves to be sensed, in contrast with the conductive structures inside distributed directional couplers 12 and 13 that are used with prior art loadpull measurement systems. The piece of conductive wire 4 is positioned at a distance D above center conductor 1. As demonstrated in patent application EP 1 316 806 A1 by Yhland, said piece of conductive wire 4 can be supported by a structure of a dielectric material and said piece of wire 4 can be integrated on said structure together with the coupled arms 2 and 3. Traveling voltage waves traveling in the slabline cause a time varying current, noted $I_S$, and cause a charge, noted $Q_S$, on the center conductor 1. For illustrating the principle of the low loss directive coupling structure 19 in FIG. 4 and FIG. 5 one will consider the case that there is only a traveling voltage wave present which is traveling to the left and that there is no traveling voltage wave present which is traveling to the right. Note that said current $I_S$ is indicated by an arrow with a black-and-white arrowhead on FIG. 5. Said charge $Q_S$ is indicated on FIG. 4 by a series of "+" symbols. Said charge $Q_S$ causes an electrical field which is illustrated in FIG. 4 by the vectors E. Said electrical field interacts with the charged particles in the piece of conductive wire 4. Said electrical field induces a current $I_{1E}$ in coupled arm 2 and induces a current $I_{2E}$ in coupled arm 3. Said current $I_{1E}$ and said current $I_{1E}$ are indicated on FIG. 4 by arrows with black-and-white arrowheads. The current $I_{1E}$ and the current $I_{2E}$ are proportional to the time derivative of the amplitude of the electrical field and they are in phase with each other. Since the length of the piece of conductive wire 4 is small when compared to the wavelength of the traveling voltage waves on the main line, both coupled arms 2 and 3 are substantially subjected to the same electrical field vector such that the amplitude of current $I_{1E}$ is substantially the same as the amplitude of current $I_{2E}$.

Current $I_S$ on the surface of center conductor 1 causes a magnetic field which is illustrated in FIG. 5 by the vectors H. A cross in a circle indicates that the vector is pointing away from the observer of the drawing; a dot in a circle indicates that the vector is pointing towards the observer of the drawing. The magnetic field interacts with the charged particles in the piece of conductive wire 4. The magnetic field causes a current $I_{1H}$ in coupled arm 2 and causes a current $I_{2H}$ in coupled arm 3. Current $I_{1H}$ and current $I_{2H}$ are indicated on FIG. 5 by arrows with black-and-white arrowheads. Current $I_{1H}$ and current $I_{2H}$ are proportional to the time derivative of the amplitude of the magnetic field and they are in opposite phase with each other. Since the length of the piece of conductive wire 4 is small when compared to the wavelength of the traveling voltage waves on the main line, both coupled arms 2 and 3 are substantially subjected to the same magnetic field vector such that the amplitude of the current $I_{1H}$ is substantially the same as the amplitude of current $I_{2H}$. The dimensions of the loop are typically designed such that the amplitude of the electrically induced currents $I_{1E}$ and $I_{2E}$ is, in the ideal case, equal to the amplitude of the magnetically induced currents $I_{1H}$ and $I_{2H}$.

The total current flowing into the center conductor 7 of coupled arm 2 is the superposition of the current $I_{1E}$ and the current $I_{1H}$. Consider FIG. 5 and assume that there is a travelling voltage wave travelling to the left. The magnetic and the electrical fields are in phase relative to each other and as can be derived from FIG. 4 and FIG. 5 there is, in this case, destructive interference between the electrically induced current $I_{1E}$ and the magnetically induced current $I_{1H}$. As a consequence there is no net current flowing into the center conductor 7 of coupled arm 2 and no signal will be present in coupled arm 2. The total current flowing into the center conductor 8 of coupled arm 3 is the superposition of said current $I_{2E}$ and said current $I_{2H}$. As can be derived from FIG. 4 and FIG. 5 there is constructive interference between electrically induced current $I_{2E}$ and magnetically induced current $I_{2H}$. As a consequence there is a net current flowing into the center conductor 8 of coupled arm 3. The net current injected into the center conductor 8 of coaxial line 3 results in a traveling voltage wave in the coaxial line 3. The traveling voltage wave in the coaxial line 3 travels away from the piece of conductive wire 4 and is proportional to the traveling voltage wave traveling to the left on the main line.

The structure described in FIG. 3 is symmetrical. This implies that a traveling voltage wave on the main line which travels to the right will not cause a signal in coupled arm 3 but will only cause a signal in coupled arm 2. The general case is analyzed by considering a superposition of the case where there is a traveling voltage wave on the main line traveling to the right and the case where there is a traveling voltage wave on the main line traveling to the left. From the general case one concludes that the structure described in FIG. 3 has dual directional coupler characteristics. It is clear to people skilled in the arts that the length of the above described coupling structure can be made significantly smaller than the length of an equivalent classic distributed coupler since said coupling structure is significantly shorter and as such minimizes energy losses, which are mainly due to the skin effect.

In case one is only interested in sensing one of the two travelling voltage waves one can replace the redundant coupled arm 2 or 3 by a resistor with an impedance that equals the characteristic impedance of the redundant coupled arm 2 or 3. Said resistor is in that case connected between the end of the piece of conductive wire 4 that would be connected to the center conductor 7 or 8 of the redundant coupled arm 2 or 3 and a ground terminal. Said ground terminal is usually the outer conductor of the non-redundant coupled arm 3 or 2. One can even combine two single directive coupling structures as mentioned above in order to build one dual directive coupling structure. This is explained in great detail in European patent application EP 1 316 806, by Yhland and Stenarson.

In practice the amplitudes of said electrically induced currents $I_{1E}$ and $I_{2E}$ can never be made exactly equal to the amplitudes of the magnetically induced currents $I_{1H}$ and $I_{2H}$. This results in a less than perfect directivity of the described dual directional coupling structure 19. One denotes the coupling factor between the coupled arm 2 and the traveling voltage wave traveling on the main line to the right "alpha" and the coupling factor between the coupled arm 2 and the traveling voltage wave traveling on the main line to the left "beta". The coupling factor between the coupled arm 3 and the traveling voltage wave traveling in the main line to the left approximately equals "alpha" and the coupling factor between the coupled arm 3 and the traveling voltage wave traveling on the main line to the right approximately equals "beta". The dimensions of the whole structure are optimized such that the ratio "alpha" divided by "beta" is large. The ratio "alpha" divided by "beta" corresponds to the directivity of the dual directional coupling structure 19.

It is clear for people skilled in the arts that the principle described above is not restricted to an electromagnetic waveguiding structure that is a slabline, but that it can be applied to construct low insertion loss directive coupling structures in many other electromagnetic waveguiding structures including e.g. microstrip lines, rectangular waveguides, coaxial waveguides, slot lines and coplanar waveguides.

Use of the Low Insertion Loss Coupling Structure to Sense Voltage and Current Waveforms in Combination with an Impedance Tuning Equipment Our invention consists of a novel apparatus and a novel method. The apparatus consists of the novel combination of the abovementioned low insertion loss loop type coupling structure with impedance tuning equipment. A first preferred embodiment of the invention is illustrated twice in FIG. 6. The novel apparatus is a combination of an impedance tuning equipment 21 with a low insertion loss directive coupling structure 18, said combination being present at the input terminal of the DUT 14. The novel combination is also present at the output terminal of the DUT 14, where one has a low insertion loss directive coupling structure with impedance tuning equipment. On FIG. 6 both coupled arms 22, 23 and 2, 3 of both coupling structures 18 and 19 are connected to a multiple channel broadband RF receiver 17. With the above embodiment, the loop type directive coupling structures 18 and 19 are part of a separate connectorized electromagnetic waveguiding structure that is inserted between the connectors of the impedance tuning equipment 15 and 21 and the terminals of the DUT 14. FIG. 6 represents a combined loadpull and sourcepull measurement set-up since the novel combination of said low insertion loss directive coupling structure and said impedance tuning equipment is present at the output terminal as well as the input terminal of the DUT 14. In practice a simplified set-up is often used wherein said combination is omitted at the input terminal side.

The Impedance Tuning Equipment

The impedance tuning equipment 15 is built to provide substantially any load impedance, in terms of magnitude and phase, to the terminals of the DUT 14. The impedance tuning equipment 15 consists either in one or several passive tuners, or in one or several active tuners. As described in the background section, the passive tuners are reflecting the RF energy with a controllable amplitude and phase. Said passive tuners can be either based on mechanical moving parts, or they can be based on electronic circuitry. In addition with the tuners, one or several RF loads 16 are usually required. The RF loads are most frequently 50 Ohms high power resistors, with one terminal connected to the ground. An impedance tuning equipment 15 based on passive tuners with the capability to handle more than one frequency harmonic can include several passive tuners and several loads, depending on the serial or parallel combination of tuners with or without frequency diplexers or frequency triplexers. The active tuners include one or several active RF components, like amplifiers and signal generators, in the tuning structure in order to compensate any energy losses in the electromagnetic waveguiding structures. The impedance tuning equipment 15 is most frequently connected to the output terminal of the DUT 14, usually the drain terminal of a field effect transistor or the collector terminal of a bipolar transistor, and in this particular case the term "loadpull" is commonly used. In general, the impedance tuning equipment 15 can be connected to any RF port of any RF device-under-test. In particular, when the goal is to provide varying impedance tuning at the input terminal of the DUT 14, usually the gate terminal of a field effect transistor or the base terminal of a bipolar transistor, said passive tuners or said active tuner approaches are available, but the RF loads are replaced by RF sources. In that case, the commonly used term is "sourcepull". For a multi-port nonlinear DUT 14, it can be useful to connect at each terminal a relevant impedance tuning equipment: loadpull impedance tuning equipment 15 is connected at the output terminals of the DUT 14 and sourcepull impedance tuning equipment 21 is connected to the RF input ports of the DUT 14.

ALTERNATIVE EMBODIMENT

Figure 7:
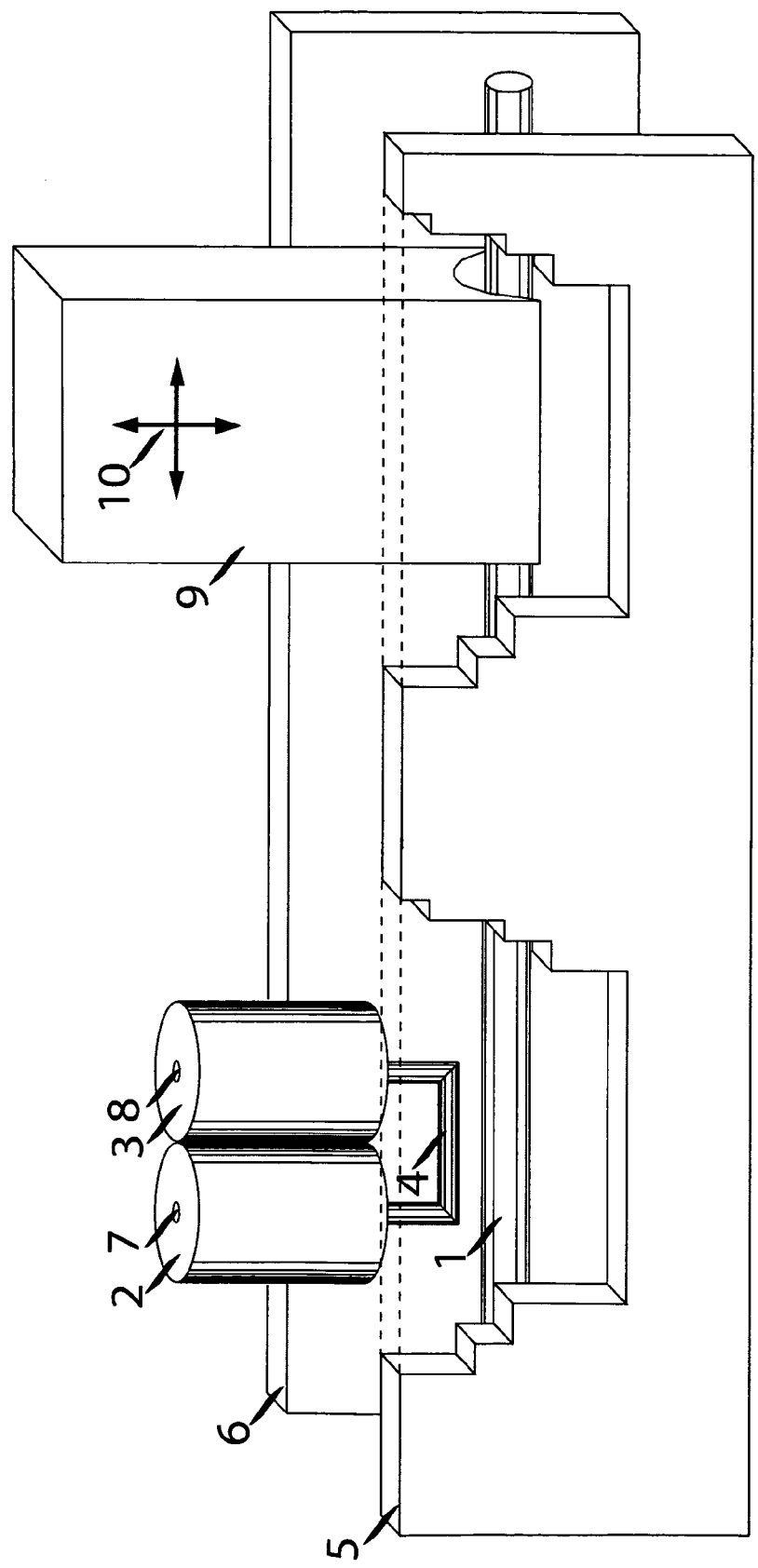
FIG. 7 Novel structure wherein the loop type coupling structure and a moveable slug are both positioned inside the slabline of a mechanical tuner.
Figure 8:
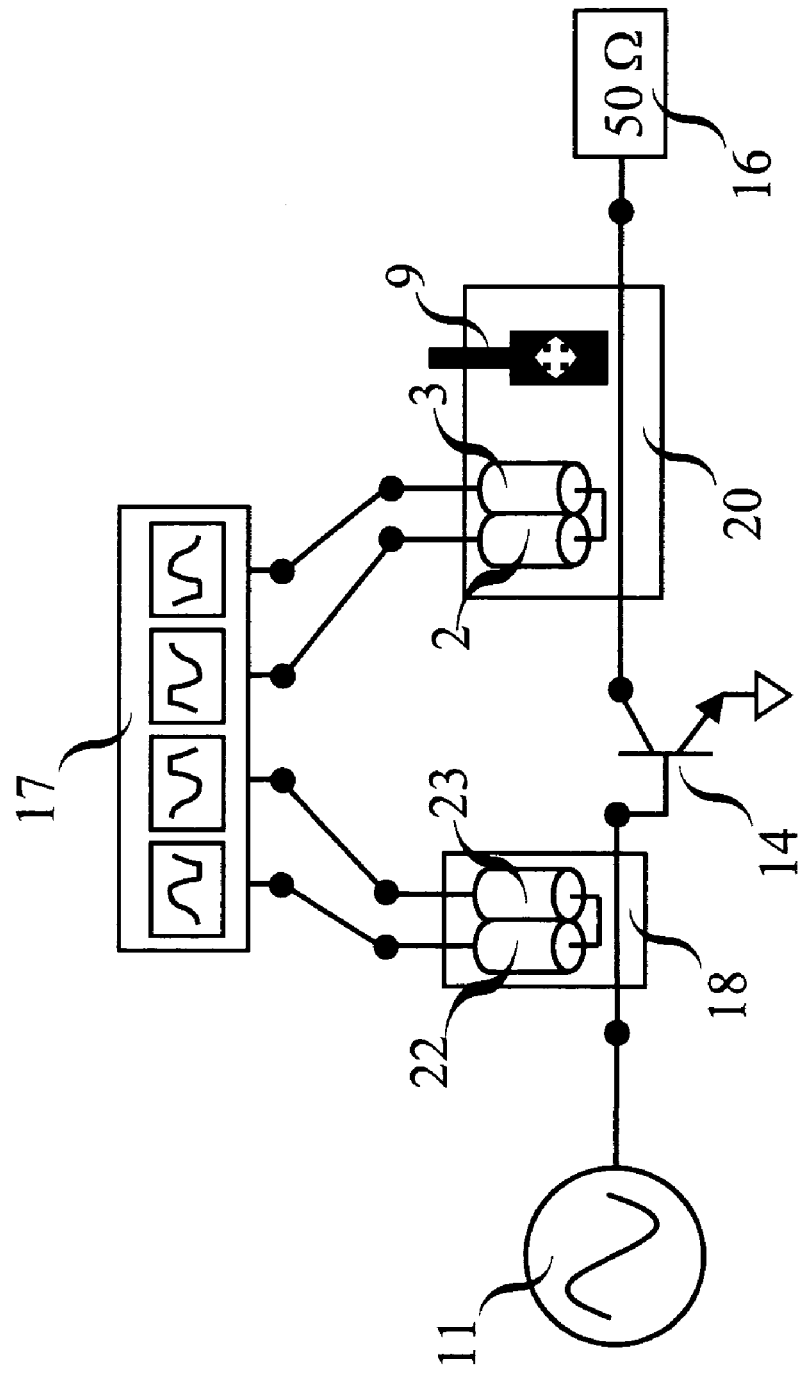
FIG. 8 Loadpull measurement setup according to the present invention wherein the loop type coupling structure is an integral part of the tuner.

An alternative embodiment of the present invention is illustrated in FIG. 7 and FIG. 8. With this embodiment the loop type directive coupling structure is fully integrated in the slabline waveguiding structure of a mechanical tuner, thereby eliminating the extra connectors that are needed with the first embodiment. The piece of conductive wire 4 is hereby placed between the two conductive plates 5 and 6 that form the ground planes of a slabline waveguiding structure of a tuner. A moveable part 9, called slug, is also placed between the above-mentioned conductive plates 5 and 6. The position of slug 9 can be changed vertically as well as horizontally, as indicated by the crossed black arrows. Slug 9 is the moveable part of the tuner that changes the reflection coefficient, and hence the impedance, as it is measured at the output connector of the tuner 20. Note that commercial tuners typically contain multiple slugs, all of which are placed inside one slabline waveguiding structure. To those skilled in the arts, it is clear that the above principle of inserting a piece of conductive wire 4 in the waveguiding structure of a tuner 20 can be applied to passive as well as active tuners, and to mechanical as well as electronic tuners.

Novel Method

The present invention also relates to a novel method wherein one applies to the DUT 14 a plurality of RF test signals and a plurality of tuned impedances and one connects one or both coupled arms 2 and 3 of said low insertion loss loop type coupling structure 19 to a broadband RF receiver 17.

ADVANTAGES OF THE PRESENT INVENTION

The present invention has the following three advantages, which are not simultaneously present in any system described in the prior art. First the impedance matching capability of the impedance tuning equipment 15 is substantially not affected by the insertion of the loop type coupling structure 19 because of the inherent low loss of said loop type coupling structure 19, in contrast to prior art where one uses a distributed coupler 13 or a resistive bridge. A second advantage is that the calibration procedure remains simple because the calibration coefficients do not depend on the variable impedance setting of the impedance tuning equipment 15. This is the case since the directive coupling structure 19 is inserted between the output terminal of the DUT 14 and the impedance tuning equipment 15, in contrast to some prior art, where the impedance tuning equipment 15 is placed in between the coupler 13 and the output terminal of the DUT 14. A third advantage is that there is no accuracy problem when the impedance tuning equipment 15 is set to reflect substantially all of the energy of a voltage wave back towards the terminal of the DUT 14. With such a setting of the impedance tuning equipment substantially no energy is send to the broadband RF receiver 17 in case the impedance tuning equipment 15 is placed between the coupler 13 and the terminal of the DUT 14. This causes noisy measurements with the abovementioned prior art.

What is claimed is:

1. An apparatus for characterizing a high-frequency device-under-test, comprising:
   a. a first electromagnetic waveguiding structure, which guides a first electromagnetic wave signal towards a first terminal of said high-frequency device-under-test and which guides a second electromagnetic wave signal away from said first terminal of said high-frequency device-under-test,
   b. a piece of conductive wire, said piece of conductive wire having a first end and a second end, and said piece of conductive wire being exposed to the electrical field and to the magnetic field of said first electromagnetic wave signal, and said piece of conductive wire being exposed to the electrical field and to the magnetic field of said second electromagnetic wave signal, and said piece of conductive wire having a length which is substantially smaller than one half of the wavelength of said first electro-magnetic wave signal, and said piece of conductive wire having a length which is substantially smaller than one half of the wavelength of said second electromagnetic wave signal,
   c. a second electromagnetic waveguiding structure, which is connected to said first end of said piece of conductive wire, whereby said second electromagnetic waveguiding structure senses said second electro-magnetic wave signal,
   d. a means for establishing a plurality of impedances at said terminal of said device-under-test,
   e. a means for determining the time domain waveform of the signal that is sensed by said second electromagnetic waveguiding structure,
   whereby said piece of conductive wire causes substantially no energy loss in said first and said second electromagnetic wave signals.

2. The apparatus of claim 1 wherein said means for establishing a plurality of impedances is located in said first electromagnetic waveguiding structure.

3. The apparatus of claim 1, wherein said means for establishing a plurality of impedances comprises a signal generator.

4. The apparatus of claim 1, further comprising a third electromagnetic waveguiding structure, which is connected to said second end of said piece of conductive wire, whereby said third electromagnetic waveguiding structure senses said first electromagnetic wave signal.

5. The apparatus of claim 4 wherein said means for establishing a plurality of impedances is located in said first electro-magnetic waveguiding structure.

6. The apparatus of claim 4, wherein said means for establishing a plurality of impedances comprises a signal generator.

7. The apparatus of claim 1, further comprising a resistor which is connected between said second end of said piece of conductive wire and a ground terminal.

8. The apparatus of claim 7 wherein said means for establishing a plurality of impedances is located in said first electro-magnetic waveguiding structure.

9. The apparatus of claim 7, wherein said means for establishing a plurality of impedances comprises a signal generator.

10. A method for characterizing a high-frequency device-under-test, comprising the steps of:
   a. connecting a first electromagnetic wave guiding structure to a first terminal of said high-frequency device-under-test, b. guiding a first electromagnetic wave signal through said first electro-magnetic waveguiding structure towards said first terminal of said high-frequency device-under-test, c. guiding a second electromagnetic wave signal away from said first terminal of said device-under-test, d. providing a piece of conductive wire, which has a first end and a second end, and which has a length that is substantially shorter than one half of the wavelength of said first electromagnetic wave signal, and which has a length that is substantially shorter than one half of the wavelength of said second electromagnetic wave signal, e. exposing said piece of conductive wire to the electrical field and to the magnetic field of said first electromagnetic wave signal, f. exposing said piece of conductive wire to the electrical field and the magnetic field of said second electromagnetic wave signal, g. connecting a second electromagnetic waveguiding structure to said first end of said piece of conductive wire, whereby said second electro-magnetic waveguiding structure senses said second electromagnetic wave signal, h. establishing a plurality of reflection coefficients at said first terminal of said device-under-test, i. determining the time domain waveform of the signal that is sensed by said second electromagnetic waveguiding structure, whereby inserting said piece of conductive wire causes substantially no energy loss in said first and said second electromagnetic wave signals.

11. Said method of claim 10 wherein said establishing of a plurality of reflection coefficients is done by inserting a moveable part in said first electro-magnetic waveguiding structure.

12. Said method of claim 10 wherein said establishing of a plurality of reflection coefficients is done by connecting a signal generator to said first electro-magnetic waveguiding structure.

13. Said method of claim 10 further comprising the step of connecting a third electromagnetic waveguiding structure to said second end of said piece of conductive wire, whereby said third electromagnetic waveguiding structure senses said first electromagnetic wave signal.

14. Said method of claim 13 wherein said establishing of a plurality of reflection coefficients is done by inserting a moveable part in said first electro-magnetic waveguiding structure.

15. Said method of claim 13 wherein said establishing of a plurality of reflection coefficients is done by connecting a signal generator to said first electro-magnetic waveguiding structure.

16. Said method of claim 10 further comprising the step of connecting a resistor between said second end of said piece of conductive wire and a ground terminal.

17. Said method of claim 16 wherein said establishing of a plurality of reflection coefficients is done by inserting a moveable part in said first electro-magnetic waveguiding structure.

18. Said method of claim 16 wherein said establishing of a plurality of reflection coefficients is done by connecting a signal generator to said first electro-magnetic waveguiding structure.

* * * * *